(12) United States Patent
Katterbauer et al.

(10) Patent No.: US 12,346,642 B1
(45) Date of Patent: Jul. 1, 2025

(54) METHOD FOR IMPROVING UNCONVENTIONAL HYDROGEN DEVELOPMENT

(71) Applicant: SAUDI ARABIAN OIL COMPANY, Dhahran (SA)

(72) Inventors: Klemens Katterbauer, Dhahran (SA); Abdallah A. AlShehri, Dhahran (SA); Abdulaziz S. Al-Qasim, Dammam (SA); Ali A. AlYousif, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 1 day.

(21) Appl. No.: 18/620,257

(22) Filed: Mar. 28, 2024

(51) Int. Cl.
*G06F 30/28* (2020.01)

(52) U.S. Cl.
CPC .................... *G06F 30/28* (2020.01)

(58) Field of Classification Search
CPC ................. G06F 30/28; G06F 30/20
See application file for complete search history.

(56) References Cited

U.S. PATENT DOCUMENTS

| | | | |
|---|---|---|---|
| 4,706,751 A * | 11/1987 | Gondouin | E21B 43/24 166/266 |
| 10,260,319 B2 | 4/2019 | Sarduy et al. | |
| 2012/0321528 A1* | 12/2012 | Peters | C01B 17/04 422/198 |
| 2016/0186046 A1* | 6/2016 | Barreto | C09K 8/68 166/267 |

(Continued)

FOREIGN PATENT DOCUMENTS

| | | |
|---|---|---|
| CN | 112749823 A | 5/2021 |
| WO | 2022229928 A1 | 11/2022 |
| WO | 2023102046 A1 | 6/2023 |

OTHER PUBLICATIONS

Dimopoulos et al., "Hydrogen-natural gas blends fuelling passenger car engines: combustion, emissions and well-to-wheels assessment," International Journal of Hydrogen Energy, vol. 33, Oct. 17, 2008, pp. 7224-7236, 13 pages.

(Continued)

*Primary Examiner* — Emerson C Puente
*Assistant Examiner* — Alfred H B Wechselberger
(74) *Attorney, Agent, or Firm* — Osha Bergman Watanabe & Burton LLP

(57) ABSTRACT

A method for improving natural hydrogen recovery through hydrogen fracturing includes obtaining field data from a hydrogen-containing formation and generating, by a computer processor and a series of models, a surface production rate, a compression value where the compression value is a pressure of pressurized hydrogen used to fracture the hydrogen-containing formation, a well path, a set of well separation distances, a fracture half-length where the fracture half-length is half of a total length of a fracture caused by a fracturing of the hydrogen-containing formation using pressurized hydrogen, and a well production rate. Using a well analysis, the fracture half-length, the well path, the well separation distances, and the well production rate are evaluated. Based on the surface production rate, the compression value, the fracture half-length, the well path, the well separation distances, the well production rate, and the field data, field operations are performed on the hydrogen-containing formation.

15 Claims, 5 Drawing Sheets

(56) References Cited

U.S. PATENT DOCUMENTS

| | | | |
|---|---|---|---|
| 2018/0135397 A1* | 5/2018 | Mendell | C09K 8/62 |
| 2021/0189856 A1* | 6/2021 | Gates | E21B 43/243 |
| 2022/0082001 A1* | 3/2022 | Balan | E21B 33/12 |
| 2022/0277219 A1* | 9/2022 | Tora | G06N 3/10 |
| 2023/0074500 A1* | 3/2023 | Khan | G01V 20/00 |
| 2023/0323756 A1* | 10/2023 | Darrah | E21B 43/26 |
| 2024/0018854 A1* | 1/2024 | Chhatre | E21B 43/122 |

OTHER PUBLICATIONS

Elaoud et al., "Transient flow in pipelines of high-pressure hydrogen-natural gas mixtures," International Journal of Hydrogen Energy, vol. 33, Aug. 22, 2008, pp. 4824-4832, 9 pages.

Melaina et al., "Blending hydrogen into natural gas pipeline networks: a review of key issues," NREL, National Renewable Energy Laboratory, Technical Report, Mar. 2013, 131 pages.

Park et al., "Power output characteristics of hydrogen-natural gas blend fuel engine at different compression ratios," International Journal of Hydrogen Energy, vol. 37, Mar. 10, 2012, pp. 8681-8687, 7 pages.

Zgonnik, "The occurrence and geoscience of natural hydrogen: A comprehensive review," Earth-Science Reviews, vol. 203, Feb. 24, 2020, 103140, 51 pages.

Zhan et al., "Subsurface sedimentary structure identification using deep learning: A review," Earth-Science Reviews, vol. 239, Apr. 2023, 24 pages.

\* cited by examiner

METHOD FOR IMPROVING UNCONVENTIONAL HYDROGEN DEVELOPMENT

BACKGROUND

When combusted, hydrogen gas (H2), or molecular hydrogen, produces heat and water. Unlike the combustion of fossil fuels such as coal, oil, and natural gas, the resulting water vapor produced from the combustion of H2 contains no pollutants. Therefore, a promising solution to current environmental challenges is H2 combined with efficient energy production.

Due to the difficulties of sourcing and extracting naturally occurring H2, or native hydrogen, most of the H2 produced today is generated through steam methane reforming (SMR) of natural gas. This process occurs when methane is combined with water at high temperatures to produce carbon dioxide (CO2) and H2. H2 produced by SMR is termed "grey hydrogen" when the waste CO2 is released to the atmosphere. H2 produced by SMR is called "blue hydrogen" when the waste CO2 is captured and stored underground in naturally occurring rock formations such as former natural gas or oil reservoirs, depleted coal beds, or saline aquifers.

Another, more environmentally friendly, method of producing H2 is to use water as feedstock. Water is an ideal source for producing H2 because oxygen is the only by-product released during processing. The hydrogen produced through the decomposition of water when using a renewable energy source is called "green hydrogen." Currently, the most developed commercially available technology for producing hydrogen from water is called electrolysis. Water electrolysis is the decomposition of water into its basic components, H2 and oxygen (O), through passing electric current. Native hydrogen, also known as "white hydrogen," is naturally occurring molecular hydrogen on or in Earth. Native hydrogen has rarely been sourced due to the scarcity of H2 in the sedimentary basins where oil and gas companies typically drill.

A significant challenge in the development of natural hydrogen is the extraction of the hydrogen from the source rocks. Given the low permeability and natural flow of hydrogen, fracturing the rock for the enhancement of hydrogen plays an essential role.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a method for improving natural hydrogen recovery through hydrogen fracturing, the method comprising: obtaining field data from a hydrogen-containing formation; generating, by a computer processor and a first model, a first surface production rate based, at least in part, on the field data; generating, by the computer processor and a second model, a first compression value based, at least in part, on the field data, wherein the first compression value is a pressure of pressurized hydrogen used to fracture the hydrogen-containing formation; generating, by the computer processor and a third model, a first well path and a first set of one or more well separation distances based, at least in part, on the field data; generating, by the computer processor and a fourth model, a first fracture half-length based, at least in part, on the field data, wherein the first fracture half-length is half of a total length of a fracture caused by a fracturing of the hydrogen-containing formation using pressurized hydrogen; generating, by the computer processor and a fifth model, a first well production rate based, at least in part, on the field data; evaluating, by the computer processor, the first fracture half-length, the first well path, the first set of one or more well separation distances, and the first well production rate based, at least in part, on a well analysis; and performing one or more field operations on the hydrogen-containing formation based, at least in part, on the first surface production rate, the first compression value, the first fracture half-length, the first well path, the first set of one or more well separation distances, the first well production rate, and the field data.

In one aspect, embodiments disclosed herein relate to a system for fracturing a hydrogen-containing formation, the system comprising: a hydraulic fracturing system configured to: inject a pressurized hydrogen into the hydrogen-containing formation, fracture the hydrogen-containing formation using the injected pressurized hydrogen, forming a fractured hydrogen-containing formation, and recover natural hydrogen from the fractured hydrogen-containing formation; and a well monitoring system configured to: receive, by a computer processor, field data from the hydrogen-containing formation; generate, by the computer processor and a first model, a first surface production rate based, at least in part, on the field data; generate, by the computer processor and a second model, a first compression value based, at least in part, on the field data, wherein the first compression value is a pressure of pressurized hydrogen used to fracture the hydrogen-containing formation; generate, by the computer processor and a third model, a first well path and a first set of one or more well separation distances based, at least in part, on the field data; generate, by the computer processor and a fourth model, a first fracture half-length based, at least in part, on the field data, wherein the first fracture half-length is half of a total length of a fracture caused by a fracturing of the hydrogen-containing formation using pressurized hydrogen; generate, by the computer processor and a fifth model, a first well production rate based, at least in part, on the field data; evaluate, by the computer processor, the first fracture half-length, the first well path, the first set of one or more well separation distances, and the first well production rate based, at least in part, on a well analysis; and perform one or more field operations on the hydrogen-containing formation based, at least in part, on the first surface production rate, the first compression value, the first fracture half-length, the first well path, the first set of one or more well separation distances, the first well production rate, and the field data.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

Figure 1:
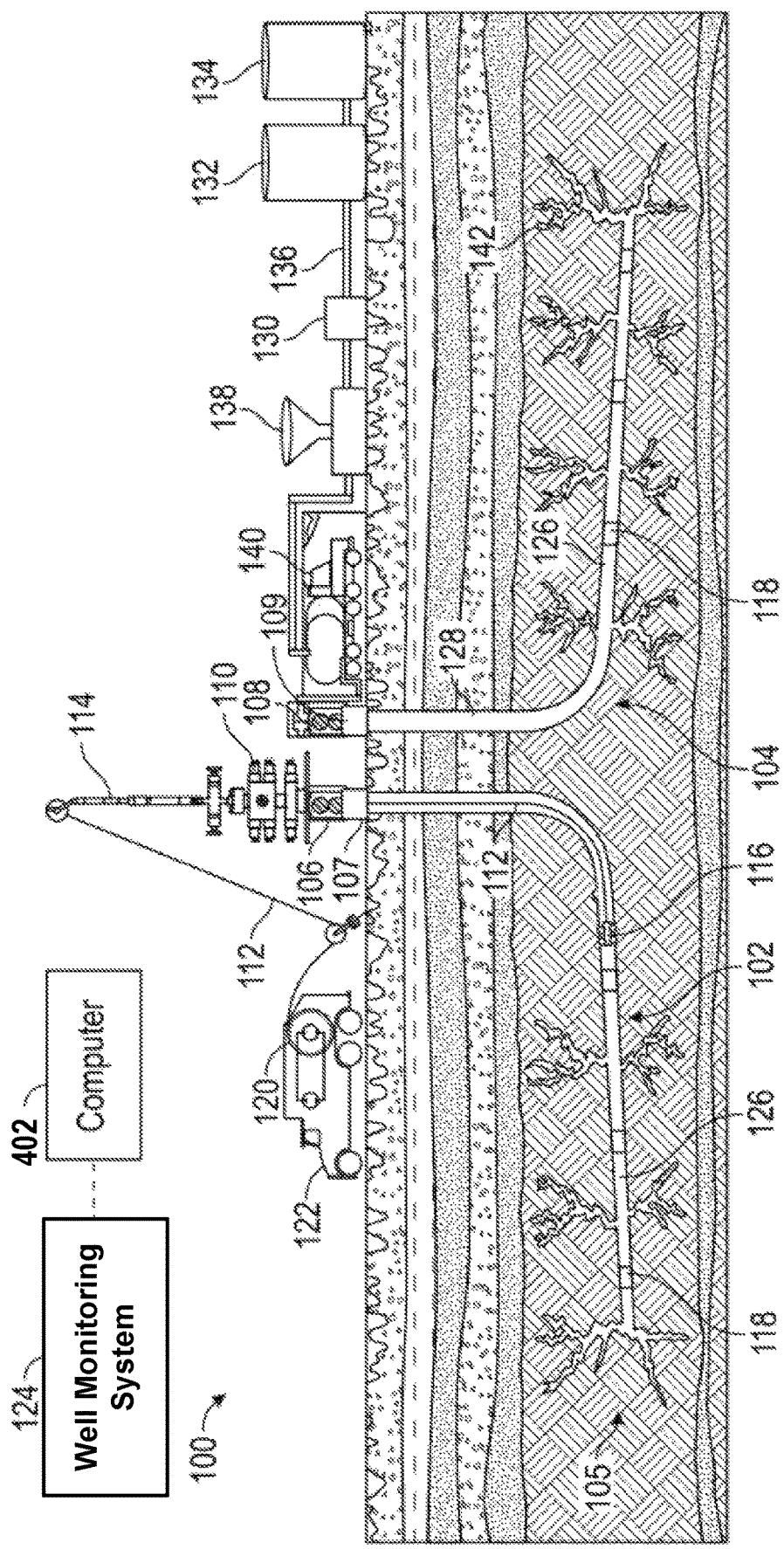
FIG. 1 illustrates a hydraulic fracturing operation according to one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

It is to be understood that the singular forms "a," "an," and "the" include plural referents unless the context clearly dictates otherwise. For example, a "formation" may include any number of "formations" without limitation.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

In the following description of FIGS. 1-4, any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

Natural hydrogen is an ideal energy source due to the lack of pollutants that result upon combustion. However, the challenge has been in sourcing natural hydrogen reservoirs and subsequently recovering the natural hydrogen in a clean, efficient, and cost-effective manner.

The most promising sources of natural hydrogen have been found in unconventional hydrogen formations. Unconventional hydrogen formations are rock formations where the hydrogen is trapped within small spaces in the rock, as opposed to a conventional formation where the desired natural resource is located in a large, open reservoir. Hydraulic fracturing with a fluid containing carbon dioxide is the method typically used to recover natural resources from an unconventional rock formation, such as oil and natural gas. However, in the case of hydrogen, this method is not ideal. Using CO2 to recover hydrogen can lead to contamination of the recovered hydrogen, resulting in costs to clean the hydrogen. Current methods of fracturing also have a negative environmental impact due to unwanted pollutants and excessive water usage. Additionally, the physical properties of hydrogen make it difficult to extract from the formation using the conventional methods of hydraulic fracturing.

Embodiments disclosed herein relate to the development of an intelligent advisory system and technology for the recovery of hydrogen from natural hydrogen formations utilizing hydrogen-fracturing technology. Fracturing using hydrogen is a novel technique that involves injecting pressurized hydrogen into a well to create or enhance fractures in the rock formation. Advantages of using hydrogen fracturing over conventional hydraulic fracturing include a reduction in water consumption, a reduction in greenhouse gas emissions, less contamination to the recovered hydrogen, and less damage to the formation.

Some embodiments disclosed herein relate to a method for improving natural hydrogen recovery through hydrogen fracturing. The method provides advisory parameters to facilitate the recovery of natural hydrogen from a hydrogen-containing formation using hydraulic fracturing with pressurized hydrogen. Specifically, for a targeted hydrogen-containing formation, the method uses multiple data analysis models to estimate the fracture half-length, predict the production of hydrogen from the well, and provide recommendations towards an optimal well placement strategy. Advantageously, embodiments disclosed herein enable the cost-efficient production of natural hydrogen and the real-time assessment of the profitability of operations. Some embodiments support the use of a machine learning advisory process to optimize the fracturing of the hydrogen source rock and the recovery of the natural hydrogen from the hydrogen-containing formation.

Other embodiments disclosed herein relate to a method and system for fracturing a hydrogen-containing formation. More specifically, the method and system facilitate the recovery of natural hydrogen from a hydrogen-containing formation using hydraulic fracturing with pressurized hydrogen. Pressurized hydrogen may be utilized to fracture the hydrogen-containing formation in order to enable the hydrogen to flow efficiently and cleanly from the hydrogen-containing formation. Utilizing pressurized hydrogen to recover natural hydrogen through fracturing eliminates the contamination of the recovered hydrogen by CO2 or other conventional fracturing fluids. Additionally, the natural combustible properties of hydrogen can be used to aid in the process of fracturing the hydrogen-containing formation.

Further, in some embodiments, the method and system provide advisory parameters to facilitate the recovery of natural hydrogen from the hydrogen-containing formation using hydraulic fracturing with pressurized hydrogen.

Specifically, for the targeted hydrogen-containing formation, the method uses multiple data analysis models to estimate the fracture half-length, predict the production of hydrogen from the well, and provide recommendations towards an optimal well placement strategy. Advantageously, embodiments disclosed herein enable the cost-efficient production of natural hydrogen and the real-time assessment of the profitability of operations. Some embodiments support the use of a machine learning optimization process to optimize the fracturing of the hydrogen source rock and the recovery of the natural hydrogen.

The hydrogen-containing formation may be an unconventional hydrogen-containing formation made up of layers of rock, such as shale or mudstone, that store natural hydrogen within pores of the rock. Permeability is the measure of how easily fluids and gas, such as hydrogen, flow through the rock. Unconventional hydrogen-containing formations typically have extremely low permeability. As such, the hydrogen may be stationary or slowly flow through the rock. In unconventional reservoirs, fractures induced by hydraulic fracturing are the primary conduits for flow and production.

FIG. 1 shows a hydraulic fracturing system 100 undergoing a hydraulic fracturing operation in accordance with one or more embodiments. The hydraulic fracturing operation and hydraulic fracturing system 100 are for illustration purposes only. The scope of this disclosure is intended to encompass any type of hydraulic fracturing system 100 and hydraulic fracturing operation. In general, a hydraulic fracturing operation includes two separate operations: a perforation operation and a pumping operation.

In further embodiments, a hydraulic fracturing operation is performed in stages and on multiple wells that are geographically grouped. A singular well may have anywhere from one to more than forty stages. Typically, each stage includes one perforation operation and one pumping operation. While one operation is occurring on one well, a second operation may be performed on the other well. As such, FIG. 1 shows a hydraulic fracturing operation occurring on a first well 102 and a second well 104. The first well 102 is undergoing the perforation operation and the second well 104 is undergoing the pumping operation.

The first well 102 and the second well 104 are horizontal wells meaning that each well includes a vertical section and a lateral section. The lateral section is a section of the well that is drilled at least eighty degrees from vertical. However, this disclosure is not meant to be limited to a horizontal well, as any well orientation (horizontal, vertical, deviated, etc.) may be used herein for fracturing. In one or more embodiments, the first well 102 and the second well 104 are drilled into a hydrogen-containing formation 105. The hydrogen-containing formation 105 is a porous formation that contains hydrogen that may be desired to be recovered.

The first well 102 is capped by a first wellhead 107 and the second well 104 is capped by a second wellhead 109. A wellhead 107, 109 is the portion of the well 102, 104 that houses the surface extending portion of downhole tubulars, such as casing 126 strings. The wellhead 107, 109 includes spools and valves that are used to access the well 102, 104. In accordance with one or more embodiments, the wellhead 107, 109 is the conduit through which most downhole operations are performed through. The wellhead 107, 109 may also be the device that equipment is connected to in order to perform operations on the well 102, 104.

In a hydraulic fracturing operation, a first frac tree 106 is connected to the first wellhead 107 and a second frac tree 108 is connected to the second wellhead 109. A frac tree 106, 108 is similar to a Christmas/production tree, but is specifically installed for the hydraulic fracturing operation. Frac trees 106, 108 tend to have larger bores and higher-pressure ratings than a Christmas/production tree would have. Further, hydraulic fracturing operations require proppant laden fluids pumped into the well at high pressures, so the frac tree 106, 108 is designed to handle a higher rate of erosion.

In accordance with one or more embodiments, both the first well 102 and the second well 104 have undergone three stages and are shown in FIG. 1 as undergoing the fourth stage. The second well 104 has already undergone the fourth stage perforation operation and is currently undergoing the fourth stage pumping operation. The first well 102 is undergoing the fourth stage perforating operation and has yet to undergo the fourth stage pumping operation.

In accordance with one or more embodiments, the perforating operation includes installing a wireline blow out preventor (BOP) 110 onto the first frac tree 106. A wireline BOP 110 is similar to a drilling BOP; however, a wireline BOP 110 has seals designed to close around (or shear) wireline 112 rather than drill pipe. A lubricator 114 is connected to the opposite end of the wireline BOP 110. A lubricator 114 is a long, high-pressure pipe used to equalize between downhole pressure and atmosphere pressure in order to run downhole tools, such as a perforating gun 116, into the well.

The perforating gun 116 is pumped into the first well 102 using the lubricator 114, wireline 112, and fluid pressure. In accordance with one or more embodiments, the perforating gun 116 is equipped with explosives and a frac plug 118 prior to being deployed in the first well 102. The wireline 112 is connected to a spool 120 often located on a wireline truck 122. Electronics (not pictured) included in the wireline truck 122 are used to control the unspooling/spooling of the wireline 112 and are used to send and receive messages along the wireline 112.

The electronics may also be connected, wired or wirelessly, to a well monitoring system 124 that is used to monitor and control the various operations being performed on the hydraulic fracturing system 100. The well monitoring system may also be configured to receive field data relating to a hydrogen-containing formation. Based, at least in part, on the field data, the well monitoring system can subsequently generate advisory parameters to facilitate the recovery of natural hydrogen from the hydrogen-containing formation 105. Advisory parameters that may be generated by the well monitoring system 124 include, but are not limited to, a surface production rate, a compression value, a well path, one or more well separation distances, a fracture half-length, and a well production rate. In accordance with one or more embodiments, the well monitoring system 124 is connected to or integrated with a computer 402 system. The computer 402 system is further outlined in FIG. 4.

When the perforating gun 116 reaches a predetermined depth, a message is sent through the wireline 112 to detonate the explosives, as shown in FIG. 1. The explosives create perforations penetrating through the cemented casing 126 into the surrounding hydrogen-containing formation 105. There may be more than one set of explosives on a singular perforation gun 116, each detonated by a distinct message. In accordance with one or more embodiments, multiple sets of explosives, called perforation clusters, are used to perforate at different depths along the cemented casing 126 for a singular stage. In accordance with one or more embodiments and after the explosives are detonated, another message is sent along the wireline 112 to set the frac plug 118. The frac plug 118 is used to create a barrier between frac stages and aid in well control. In alternative embodiments, the frac plug 118 may be set separately from the perforation operation without departing from the scope of the disclosure herein.

As explained above, FIG. 1 shows the second well 104 undergoing the pumping operation after the fourth stage perforating operation has already been performed and perforations are left behind in the casing 126 and the surrounding hydrogen-containing formation 105. A pumping operation includes pumping a frac fluid 128 into the perforations in order to propagate the perforations and create fractures 142 in the surrounding hydrogen-containing formation 105.

In conventional hydraulic fracturing, the frac fluid 128 often comprises a mixture of water, chemicals, and sand or other coarse material that is subsequently pumped into the well at high pressure. The water and chemicals help to create and propagate the fractures 142, while the sand or other coarse material holds the fractures 142 open. However, in one or more embodiments of the present disclosure, the frac fluid 128 utilized in fracturing using pressurized hydrogen can be mainly composed of pressurized hydrogen gas or pressurized liquid hydrogen, which may create or enhance the fractures 142 without the need for water or chemicals. In some embodiments, additives such as corrosion inhibitors, surfactants, or tracers may be mixed into the frac fluid 128 to improve the performance and safety of the pressurized hydrogen injection. Depending on the type and condition of the hydrogen-containing formation 105 and the objectives and design of the hydraulic fracturing system 100, a proppant may or may not be used.

Continuing with FIG. 1, hydrogen storage containers 130, additive storage containers 132, and proppant storage containers 134 are located on the hydraulic fracturing system 100. Frac lines 136 and transport belts (not pictured) transport the hydrogen, additives, and proppant from the storage containers 130, 132, 134 into a frac blender 138. A plurality of sensors (not pictured) are located on or in proximity to the storage containers to send signals to the monitoring system 124. The monitoring system 124 may be used to control the volume of hydrogen, additives, and proppant used in the pumping operation.

The frac blender 138 blends the hydrogen, additives, and proppant to become the frac fluid 128. The frac fluid 128 is transported to one or more frac pumps, often by pump trucks 140, to be pumped through the second frac tree 108 into the second well 104. Each pump truck 140 includes a pump designed to pump the frac fluid 128 at a certain pressure. More than one pump truck 140 may be used at a time to increase the pressure of the frac fluid 128 being pumped into the second well 104. The frac fluid 128 is transported from the pump truck 140 to the second frac tree 108 using a plurality of frac lines 136.

The fluid pressure propagates and creates the fractures 142 while the proppant props open the fractures 142 once the pressure is released. As described, additives such as corrosion inhibitors, surfactants, or tracers may be used to lower friction pressure, prevent corrosion, and to improve the performance and safety of the pressurized hydrogen injection. The pumping operation may be designed to last a certain length of time to ensure the fractures 142 have sufficiently propagated and generated a desired fracture geometry. Furthermore, the frac fluid 128 may have different make ups throughout the pumping operation to optimize the pumping operation without departing from the scope of the disclosure herein.

In one or more embodiments, as described above, the frac fluid 128 can be pressurized hydrogen. The pressurized hydrogen can take different forms, depending on the source, storage, temperature conditions, and delivery of the pressurized hydrogen. The most common form of pressurized hydrogen that can be used in fracturing is gaseous hydrogen. Pressurized gaseous hydrogen is produced by compressing gaseous hydrogen at high pressures (up to 700 bar) and ambient temperature. Once pressurized, the gaseous hydrogen can be stored in cylinders or tanks and then transported to the well site and injected into the well.

In one or more embodiments, another possible form of pressurized hydrogen that can be used in fracturing is liquid hydrogen. Pressurized liquid hydrogen is produced by cooling and liquefying gaseous hydrogen to very low temperatures (around −253° C.) and moderate pressures (around 30 to 50 bar). The pressurized liquid hydrogen can then be stored and transported to the well site in cryogenic containers. Liquid hydrogen exhibits a higher energy density than gaseous hydrogen, resulting in less volume needed to store the same amount of hydrogen. However, liquid hydrogen requires more energy and equipment to produce and maintain, and it also may pose more safety and environmental risks than gaseous hydrogen.

In one or more embodiments, as described above, the frac fluid 128 in the form of pressurized hydrogen injected into the hydrogen-containing formation may form fractures 142, resulting in a fractured hydrogen-containing formation 105. The pressure range of pressurized liquid hydrogen and pressurized gaseous hydrogen used in fracturing depends upon the properties and characteristics of the hydrogen-containing formation 105, the objectives and design of the hydraulic fracturing system 100, and the availability and quality of the well log data. More specifically, the pressure of the frac fluid 128 should be high enough to overcome the natural pressure of the hydrogen-containing formation 105 and to create or enhance the fractures 142 in the hydrogen-containing formation 105, but not too high as to cause unwanted damage or leakage to the wellbore, the casing, or the surface equipment.

The pressure of the frac fluid 128 can be adjusted according to the form of the hydrogen, as liquid hydrogen and gaseous hydrogen possess different properties and characteristics. For example, liquid hydrogen has a higher energy density than gaseous hydrogen, therefore less volume is needed to store the same amount of hydrogen. However, liquid hydrogen also requires more energy and equipment to produce and maintain, and it may pose more safety and environmental risks than gaseous hydrogen. In one or more embodiments, the pressure upon the pressurized hydrogen may be reduced during the fracturing, or pumping operation, thereby expanding the pressurized hydrogen from a liquid to a gaseous state.

Well log data can provide information about the type, mineralogy, porosity, permeability, pressure, temperature, and fluid saturation of the hydrogen-containing formation 105. The information provided by the well log data can subsequently facilitate the identification of an optimal pressure and interval of the frac fluid injection, as well as the type and amount of frac fluid 128 to be used in the pumping operation. In one or more embodiments, the pressure range of the pressurized hydrogen used in fracturing can be estimated by utilizing a mathematical model or a software tool. Using the well log data and the frac fluid 128 properties as inputs, a mathematical model or tool can simulate the fluid flow and fracture propagation in the well and the hydrogen-containing formation 105. The model or tool can then generate a pressure range that can optimize the performance and efficiency of the fracturing operation, as well as the safety and environmental impact of the frac fluid 128.

Those of ordinary skill in the art will appreciate that, due to the properties and characteristics of hydrogen, fracturing using pressurized hydrogen may require different or modified equipment than that used in conventional hydraulic fracturing. For example, hydrogen has a lower viscosity and density than water, and therefore hydrogen can flow faster and farther into the well and the hydrogen-containing formation than a water-based fracturing operation. However, hydrogen requires a higher injection pressure and flow rate than water to create or enhance the fractures. Hydrogen is highly flammable, making it much less stable than water, which means that it can ignite, or detonate, more easily in the presence of oxygen or other sources of ignition, but it also dissipates more quickly in the air. Therefore, for at least these reasons, fracturing using pressurized hydrogen may require special pumps, valves, pipes, sensors, and safety devices that can handle the required high injection pressure and flow rate, as well as prevent or mitigate the fire and explosion hazards that are present when fracturing using pressurized hydrogen.

In accordance with one or more embodiments, the well may be any type of well drilled through a hydrogen-containing formation 105 and having a wellhead 107, 109. As such, the well may have any orientation, trajectory, wellbore schematic, etc., without departing from the scope of the disclosure herein. Embodiments disclosed herein are outlined using the wells 102, 104 shown in FIG. 1 as an example, but the embodiments are not meant to be limited to the exact specifications of the wells 102, 104 as described in FIG. 1.

Figure 2:
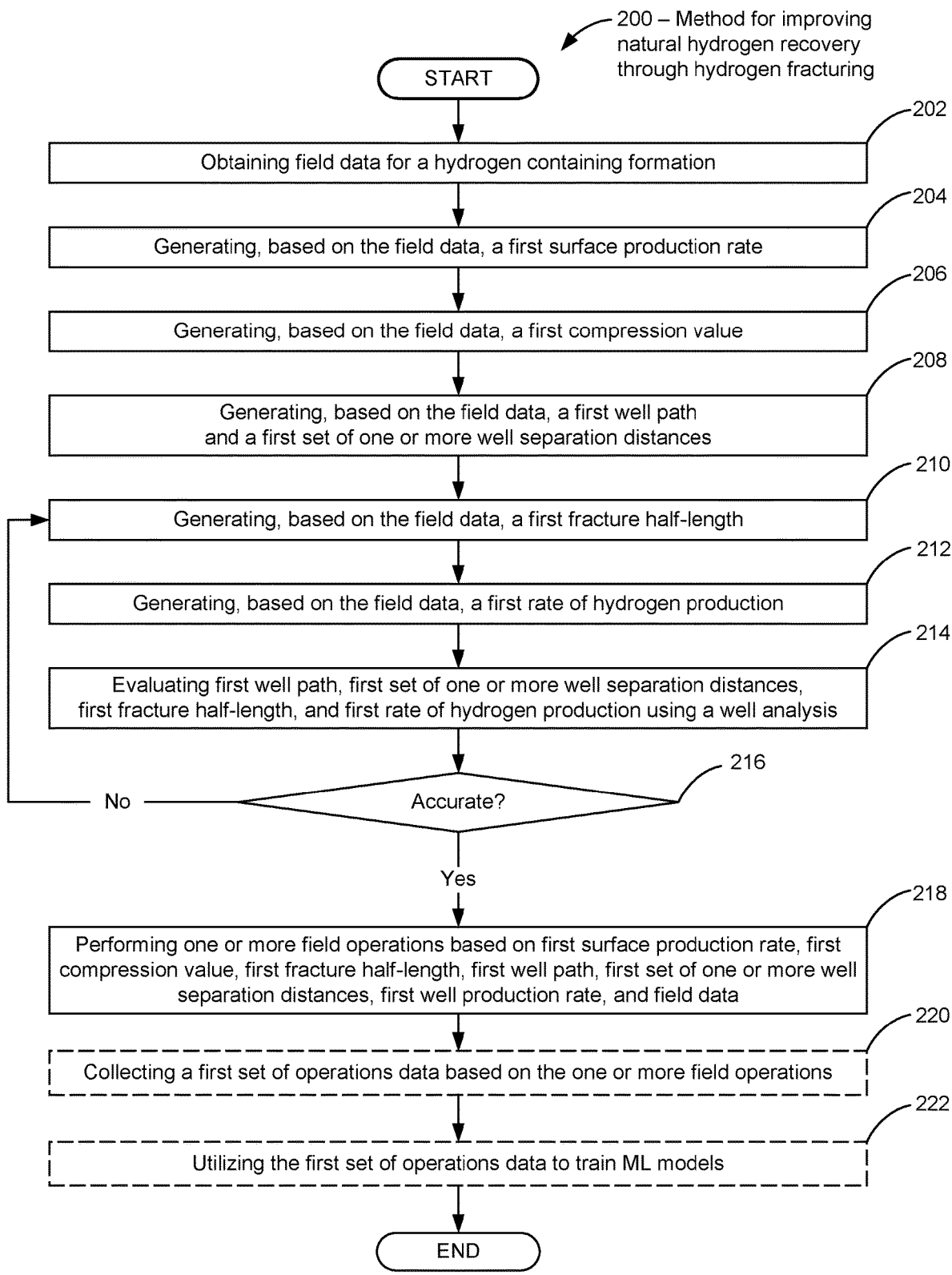
FIG. 2 illustrates a flowchart according to one or more embodiments.
Figure 4:
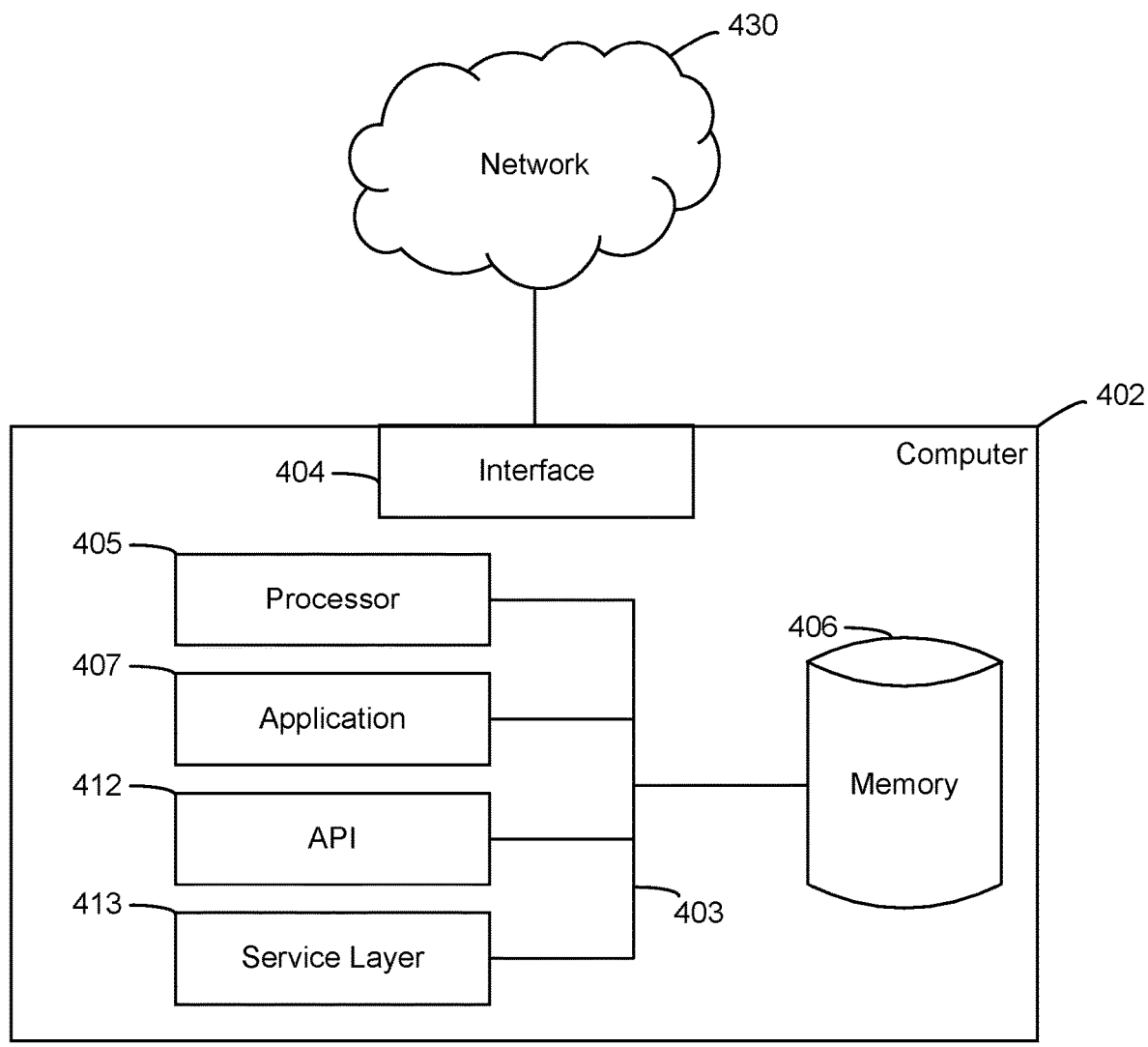
FIG. 4 illustrates a computer system in accordance with one or more embodiments.

A flowchart in accordance with one or more embodiments of the disclosure is shown in FIG. 2. Specifically, FIG. 2 describes a general method for improving natural hydrogen recovery through hydrogen fracturing 200. The method may be implemented on a well monitoring system 124 using instructions stored on a non-transitory medium that may be executed by a computer 402 system as shown in FIG. 4. While the various steps in FIG. 2 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

Initially, Block 202 describes obtaining field data for a hydrogen-containing formation. More specifically, in one or more embodiments, field data relating to a targeted hydrogen-containing formation may be obtained, where the targeted hydrogen-containing formation is a formation from which natural hydrogen may be recovered using hydraulic fracturing with hydrogen. The hydrogen-containing formation can be a natural, unconventional hydrogen reservoir located within source rock such as, for example, serpentite, basalt, coal, or shale. Non-limiting examples of field data that may be obtained can include geological data, petrophysical data, geochemical data, and economic parameters, as it relates to the hydrogen-containing formation. Geological data includes, but is not limited to, rock type and stratigraphy. Non-limiting examples of petrophysical data includes porosity and permeability. Geochemical data includes, but is not limited to, hydrogen content and mineral composition. Economic parameters include, but are not limited to, cost of drilling, cost of operation, and market price of hydrogen. Field data may be obtained through a combination of field sampling, laboratory analysis, and geophysical surveys.

Continuing with Block 202, once obtained, the field data may be processed. More specifically, in one or more embodiments, the field data relating to the hydrogen-containing formation can be processed by a computer processor. Processing the field data may involve cleaning, normalizing, and analyzing the field data. Cleaning the field data is generally done first to correct erroneous data points and remove outliers. An outlier is a data point that significantly deviates from other data points. In one or more embodiments, one or more outliers in the field data can be detected by running the field data through an outlier detection analysis, such as the Z-score method or the interquartile (IQR) method. A person of ordinary skill in the art will readily appreciate various statistical outlier detection methods that may be used in the outlier detection analysis. Any outliers detected by the outlier detection analysis may then be removed from the field data. Subsequently, the field data may be normalized, or scaled to a standard range. Once the field data is cleaned and normalized, the field data may be analyzed for trends and patterns.

Block 204 describes generating a first surface production rate based, at least in part, on the field data. More specifically, in one or more embodiments, a first model that is run on a computer processor may generate a first surface production rate based, at least in part, on the processed field data. The first surface production rate may represent the maximum surface hydrogen production, which is the highest achievable rate of hydrogen production at the surface level above the hydrogen-containing formation. The first surface production rate may be determined through computer modeling and/or simulation based on geological and operational parameters of the hydrogen-containing formation. Adjusting the operational parameters to maximize the production of hydrogen from the hydrogen-containing formation may facilitate the optimization of the first surface production rate. In one or more embodiments, the first model employs a first machine-learning (ML) algorithm that uses, at least in part, the field data as input.

Block 206 describes generating a first compression value based, at least in part, on the field data. More specifically, in one or more embodiments, a second model that is run on a computer processor may generate a first compression value based, at least in part, on the processed field data. The first compression value may be a predicted pressure of pressurized hydrogen that can be used in the hydraulic fracturing of the hydrogen-containing formation. The first compression value may be determined based on the requirements of the fracturing operation and the physical properties of the hydrogen-containing formation. The compression value can be optimized by determining the minimum compression level of pressurized hydrogen that achieves effective fracturing of the hydrogen-containing formation. In one or more embodiments, the second model employs a second ML algorithm that uses, at least in part, the field data as input.

Block 208 describes generating a first well path and a first set of one or more well separation distances based, at least in part, on the field data. More specifically, in one or more embodiments, a third model that is run on a computer processor may generate a first well path and a first set of one or more well separation distances based, at least in part, on the processed field data. The first well path can be the trajectory, or route, that a wellbore follows from the surface to the hydrogen-containing formation. The first set of one or more well separation distances refer to the distances between adjacent wells in a field. Determining the first well path and the first set of one or more well separation distances as it relates to a well in the hydrogen-containing formation is accomplished through planning the first well path and the first set of one or more well separation distances. The first well paths may be planned based on factors such as the location of the hydrogen-containing formation, geological conditions, and the type of drilling technology used to drill the well. The first set of one or more well separation distances may be planned based on factors such as reservoir characteristics, technique used to recover the hydrogen from the well, and regulatory requirements that govern the land where the hydrogen-containing formation is located. In one or more embodiments, the third model employs a third ML algorithm that uses, at least in part, the field data as input.

Block 210 describes generating a first fracture half-length based, at least in part, on the field data. More specifically, in one or more embodiments, a fourth model that is run on a computer processor may generate a first fracture half-length based, at least in part, on the processed field data. The first fracture half-length can be defined as half of the total length of a fracture that is caused by hydraulic fracturing of the hydrogen-containing formation using pressurized hydrogen. In one or more embodiments, determining a first fracture half-length for a well in the hydrogen-containing formation can be accomplished by estimating the first fracture half-length using post-fracture diagnostics, such as micro-seismic monitoring. In one or more embodiments, the fourth model employs a fourth ML algorithm that uses, at least in part, the field data as input.

Block 212 describes generating a first well production rate based, at least in part, on the field data. More specifically, in one or more embodiments, a fifth model that is run on a computer processor may generate a first well production rate based, at least in part, on the processed field data. The first hydrogen production rate may be the amount of hydrogen produced by a well over a given period of time. In one or more embodiments, determining the first hydrogen production rate for a well in a hydrogen-containing formation can be accomplished by forecasting the rate of hydrogen production based on reservoir modeling and well production history. In one or more embodiments, the fifth model employs a fifth ML algorithm that uses, at least in part, the field data as input.

Block 214 describes evaluating, by a computer processor, the first well path, the first set of one or more well separation distances, the first fracture half-length, and the first well production rate. The evaluation of these parameters can be based on a well analysis. The well analysis can assess the accuracy of the parameters through performance metrics such as hydrogen recovery factors, production rate, and economic return.

Block 216 describes the actions taken based on the results of the well analysis. More specifically, in one or more embodiments, if the first well path, the first set of one or more well separation distances, the first fracture half-length, and the first well production rate are not deemed accurate, or optimal, enough by the well analysis, actions taken may include adjusting operational parameters or revising field development plans. Subsequently, after actions are taken to adjust the relevant parameters, the third model, fourth model, and fifth model are tasked with generating a new first well path, first set of one or more well separation distances, first fracture half-length, and first well production rate. Once the first well path, the first set of one or more well separation distances, the first fracture half-length, and the first well production rate are deemed accurate, or optimal, by the well analysis, actions taken may include maintaining current operations or scaling up production.

Block 218 describes performing one or more field operations on the hydrogen-containing formation based, at least in part, on the first surface production rate, first compression value, first fracture half-length, first well path, first set of one or more well separation distances, first well production rate, and the field data. Examples of field operations performed on the hydrogen-containing formation include, but are not limited to, drilling a wellbore into the hydrogen-containing formation, hydraulic fracturing of the hydrogen-containing formation using hydrogen, hydrogen production from the hydrogen-containing formation, and maintenance of the wellbore.

Block 220 describes collecting a first set of operations data based on the one or more field operations performed on the hydrogen-containing formation. More specifically, in one or more embodiments, a first set of operations data can be collected based, at least in part, on the one or more field operations that were performed on the hydrogen-containing formation. Examples of operations data that can be collected include, but are not limited to, operational parameters such as drilling rate, production data such as flow rate, and monitoring data such as pressure.

Block 222 describes utilizing, in one or more embodiments, the first set of operations data to further enhance, or train, the ML models-namely, the first model, the second model, the third model, the fourth model, and the fifth model. More specifically, the first set of operations data can be used to train the first model, which can then produce a second production rate based on, at least in part, the field data and the first set of operations data. The first set of operations data can be used to train the second model, which can then produce a second compression value based on, at least in part, the field data and the first set of operations data. The first set of operations data can be used to train the third model, which can then produce a second well path and a second set of one or more well separation distances based on, at least in part, the field data and the first set of operations data. The first set of operations data can be used to train the fourth model, which can then produce a second fracture half-length based on, at least in part, the field data and the first set of operations data. The first set of operations data can be used to train the fifth model, which can then produce a second well production rate based on, at least in part, the field data and the first set of operations data.

In accordance with one or more embodiments, as described above, field data from the hydrogen-containing formation is processed by the five ML models to predict a first surface production rate, a first compression value, a first well path, a first set of one or more well separation distances, a first fracture half-length, and a first well production rate. In turn, this predicted data is used to perform field operations on the hydrogen-containing formation. Machine learning, broadly defined, is the extraction of patterns and insights from data. The phrases "artificial intelligence", "machine learning", "deep learning", and "pattern recognition" are often convoluted, interchanged, and used synonymously throughout the literature. This ambiguity arises because the field of "extracting patterns and insights from data" was developed simultaneously and disjointedly among a number of classical arts like mathematics, statistics, and computer science. For consistency, the term machine learning will be adopted herein, however, one skilled in the art will recognize that the concepts and methods detailed hereafter are not limited by this choice of nomenclature.

ML model types may include, but are not limited to, neural networks, random forests, generalized linear models, and Bayesian regression. ML model types are usually associated with additional "hyperparameters" which further describe the model. For example, hyperparameters providing further detail about a neural network may include, but are not limited to, the number of layers in the neural network, choice of activation functions, inclusion of batch normalization layers, and regularization strength. The selection of hyperparameters surrounding a model is referred to as selecting the model "architecture." Generally, multiple model types and associated hyperparameters are tested and the model type and hyperparameters that yield the greatest predictive performance on a hold-out set of data is selected.

In one or more embodiments, the ML models have two types of parameters: model parameters and the above-mentioned hyperparameters. Model parameters are the variables that are internal to the model and whose values can be estimated from the data. Hyperparameters are the variables that are external to the model and whose values cannot be estimated from the data, but need to be specified by the user or the practitioner.

The field data, as described above, is the data that is collected from the hydrogen-containing formation, such as the geological, geophysical, geochemical, and operational data. The field data can be used as input for the ML models to estimate the model parameters, such as the weights, coefficients, or support vectors of the model. The model parameters can define the skill of the model on the problem of predicting the first surface production rate.

In one or more embodiments, the field data obtained from the hydrogen-containing formation alone may not be enough to optimize the performance of the ML models. The ML models may also need additional parameters as $input_1$, which are the hyperparameters of the model. The hyperparameters can influence the outcome and performance of the ML models, such as the accuracy, complexity, speed, or robustness of the model. Ideally, the hyperparameters need to be tuned or optimized to find the best combination of values that can achieve the maximum performance on the data.

There are different methods or techniques for hyperparameter tuning or optimization, such as grid search, random search, Bayesian optimization, gradient-based optimization, or evolutionary algorithms. These methods or techniques can use some additional parameters as input, such as: the range or distribution of the hyperparameter values to be searched or sampled from, the number or frequency of the hyperparameter values to be tried or evaluated, the objective function or criterion to be optimized or maximized by the hyperparameter values, and the acquisition function or strategy to be used to select the next hyperparameter values to be tried or evaluated.

In one or more embodiments, some examples of hyperparameters that can be used as input for the ML models are learning rate, number of iterations or epochs, regularization, and number of hidden layers or units. Learning rate is the hyperparameter that controls how much the model parameters are updated in each iteration or epoch of the learning process. A high learning rate can speed up the learning process, but it can also cause overshooting or divergence. A low learning rate can ensure convergence, but it can also cause underfitting or slow learning. Number of iterations or epochs is the hyperparameter that controls how many times the model parameters are updated in the learning process. A high number of iterations or epochs can improve the accuracy of the model, but it can also cause overfitting or waste of resources. A low number of iterations or epochs can prevent overfitting or save resources, but it can also cause underfitting or poor performance. Regularization is the hyperparameter that controls the amount of penalty or constraint applied to the model parameters to prevent overfitting or reduce complexity. There are different types of regularization, such as L1, L2, or dropout, which have different effects on the model parameters. A high regularization can reduce overfitting or complexity, but it can also cause underfitting or loss of information. A low regularization can preserve information or flexibility, but it can also cause overfitting or instability. Number of hidden layers or units is the hyperparameter that controls the architecture or structure of the ML model, especially for neural networks or deep learning models. A high number of hidden layers or units can increase the capacity or expressiveness of the ML model, but it can also cause overfitting or high computational cost. A low number of hidden layers or units can reduce overfitting or computational cost, but it can also cause underfitting or low performance.

In accordance with one or more embodiments, the first model, the second model, the third model, the fourth model, and the fifth model utilize a long short-term memory (LSTM) network. To best understand a LSTM network, it is helpful to describe the more general recurrent neural network (RNN), for which an LSTM may be considered a specific implementation.

Figure 3A:
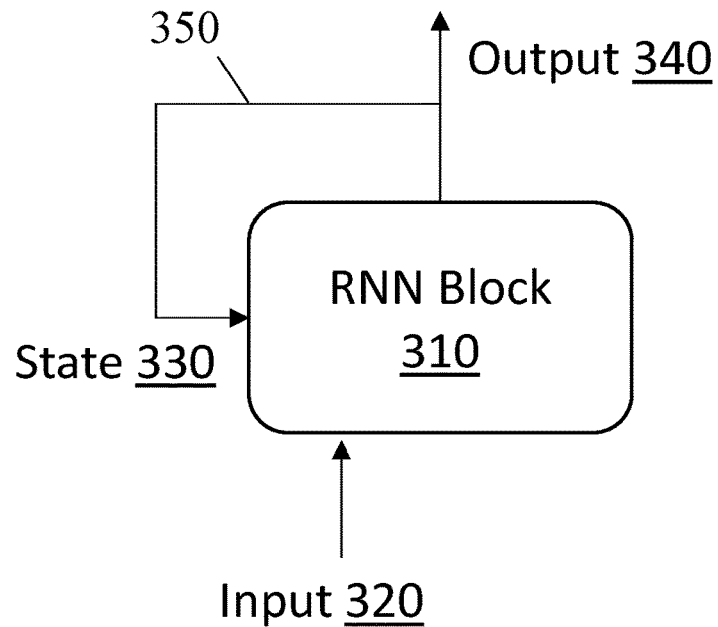
FIG. 3A illustrates a recurrent neural network in accordance with one or more embodiments.

FIG. 3A depicts the general structure of a RNN. An RNN is graphically composed of an RNN Block 310 and a recurrent connection 350. The RNN Block may be thought of as a function which accepts an Input 320 and a State 330 and produces an Output 340. Without loss of generality, such a function may be written as $$\text{Output} = \text{RNN Block}(\text{Input}, \text{State}). \qquad (4)$$

The RNN Block 310 generally comprises one or more matrices and one or more bias vectors. The elements of the matrices and bias vectors are commonly referred to as "weights" or "parameters" in the literature such that the matrices may be referenced as weight matrices or parameter matrices without ambiguity. It is noted that for situations with higher dimensional inputs (e.g. inputs with a tensor rank greater than or equal to 2), the weights of an RNN Block 310 may be contained in higher order tensors, rather than in matrices or vectors. For clarity, the present example will consider Inputs 320 as vectors or as scalars such that the RNN Block 310 comprises one or more weight matrices and bias vectors, however, one with ordinary skill in the art will appreciate that this choice does not impose a limitation on the present disclosure. Typically, an RNN Block 310 has two weight matrices and a single bias vector which are distinguished with an arbitrary naming nomenclature. A commonly employed naming convention is to call one weight matrix W and the other U and to reference the bias vector as b.

An important aspect of an RNN is that it is intended to process sequential, or ordered, data; for example, a time-series. In the RNN, the Input 320 may be considered a single part of a sequence. As an illustration, consider a sequence composed of Y parts. Each part may be considered an input, indexed by t, such that the sequence be written may as sequence=[$input_1$, $input_2$, $input_t$, ..., $input_{Y-1}$, $input_Y$]. Each Input 320 (e.g., $input_1$ of a sequence) may be a scalar, vector, matrix, or higher-order tensor. Recall that a given seismic data set is composed of $N_c$ traces (or channels) and $N_t$ discrete time steps. In accordance with one or more embodiments, each Input 320 (or element of a sequence) is an array of traces at a single time step. That is, each Input 320 is considered a vector with $N_c$ elements.

To process a sequence, an RNN receives the first ordered Input 320 of the sequence, $input_1$, along with a State 330, and processes them with the RNN Block 310 according to EQ. 4 to produce an Output 340. The Output 340 may be a scalar, vector, matrix, or tensor of any rank. For the present example, the Output 340 is considered a vector with k elements. The State 330 is of the same type and size as the Output 340 (e.g., a vector with k elements). For the first ordered input, the State 330 is usually initialized with all of its elements set to the value zero. For the second ordered Input 320, $input_2$, of the sequence, the Input 320 is processed similarly according to EQ. 4, however, the State 330 received by the RNN Block 310 is set to the value of the Output 340 determined when processing the first ordered Input 320. This process of assigning the State 330 the value of the last produced Output 340 is depicted with the recurrent connection 350 in FIG. 3A. All the Inputs 320 in a sequence are processed by the RNN Block 310 in this manner; that is, the State 330 associated with an Input 320 is the Output 340 of the RNN Block 310 produced by the previous Input 320 (with the exception of the first Input 320 in the sequence). In some implementations, each Output 340, one for each Input 310 within a sequence, is stored for later processing and use. In other implementations, only the final Output 340, or the Output 340 which is produced when the Input 320 $input_Y$ is processed by the RNN Block 310, is retained.

In greater detail, the process of the RNN Block 310, or EQ. 4, may be generally written as $$\text{Output}=\text{RNN Block}(\text{input},\text{state})=f(U \cdot \text{state}+W \cdot \text{input}+\vec{b}), \quad (5)$$

where W, U, and $\vec{b}$ are the weight matrices and bias vector of the RNN Block 310, respectively, and $f$ is an "activation function." Some functions for $f$ may include the sigmoid function $$f(x) = \frac{1}{1 + e^{-x}},$$

and rectified linear unit (ReLU) function $f(x)=\max(0, x)$, however, many additional functions are commonly employed.

To further illustrate a RNN, a pseudo-code implementation of a RNN is as follows.
RNN Algorithm
Note:
$N_c$=input length
k=output length
$W \in \mathbb{R}^{k \times k}$
$U \in \mathbb{R}^{k \times N_c}$
$\vec{b} \in \mathbb{R}^k$
1: state=$[0_1, 0_2, \ldots, 0_{k-1}, 0_k]^T$
2: for input in sequence:
3: $\vec{z}_1$=matmul(U, state)
4: $\vec{z}_2$=matmul(W, input)
5: output=$f(\vec{z}_1+\vec{z}_2+\vec{b})$
6: state=output In keeping with the previous examples, both the inputs and the outputs are considered vectors of lengths $N_c$ and k, respectively, however, in general, this need not be the case. With the lengths of these vectors defined, the shapes of the weight matrices, bias vector, and State 330 vector may be specified. To begin processing a sequence, the State 330 vector is initialized with values of zero as shown in line 1 of the pseudo-code. Note that in some implementations, the number of inputs contained within a sequence may not be known or may vary between sequences. One with ordinary skill in the art will recognize that an RNN may be implemented without knowing, beforehand, the length of the sequence to be processed. This is demonstrated in line 2 of the pseudo-code by indicating that each input in the sequence will be processed sequentially without specifying the number of inputs in the sequence. Once an Input 320 is received, a matrix multiplication operator is applied between the weight matrix U and the State 330 vector. The resulting product is assigned to the temporary variable $\vec{z}_1$. Likewise, a matrix multiplication operator is applied between the weight matrix W and the Input 310 with the result assigned to the variable $\vec{z}_2$. For the present example, due the Input 320 and Output 340 each being defined as vectors, the products in lines 3 and 4 of the pseudo-code may be expressed as matrix multiplications, however, in general, the dot product between the weight matrix and corresponding State 330 or Input 320 may be applied. The Output 340 is determined by summing $\vec{z}_1$, $\vec{z}_2$, and the bias vector $\vec{b}$ and applying the activation function $f$ elementwise. The State 330 is set to the Output 340 and the whole process is repeated until each Input 320 in a sequence has been processed.

Figure 3B:
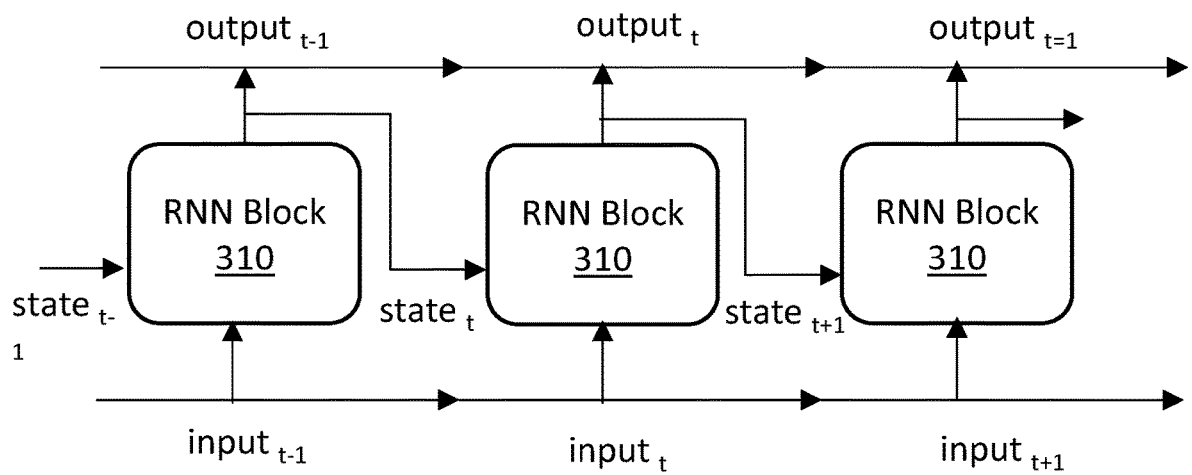
FIG. 3B illustrates an unrolled recurrent neural network in accordance with one or more embodiments.

FIG. 3B depicts an "unrolled" version of the RNN of FIG. 3A. Unrolling the RNN allows one to see how the sequential inputs, indexed by t, produce sequential outputs and how the state is passed through various inputs of the sequence. It is noted that while the "unrolled" depiction shows multiple RNN Blocks 310, these blocks are the same such that they are comprised of the same weight matrices and bias vector.

As previously stated, generally, training a machine-learned model requires that pairs of inputs and one or more targets (i.e., a training dataset) are passed to the machine-learned model. During this process the machine-learned model "learns" a representative model which maps the received inputs to the associated outputs. In the context of an RNN, the RNN receives a sequence, wherein the sequence can be partitioned into one or more sequential parts (Inputs 320 above), and maps the sequence to an overall output, which may also be a sequence. To remove ambiguity and distinguish the overall output of an RNN from any intermediate Outputs 340 produced by the RNN Block 310, the overall output will be referred to herein as a RNN result. In other words, an RNN receives a sequence and returns a RNN result. The training procedure for a RNN comprises assigning values to the weight matrices and bias vector of the RNN Block 310. For brevity, the elements of the weight matrices and bias vector will be collectively referred to as the RNN weights. To begin training the RNN weights are assigned initial values. These values may be assigned randomly, assigned according to a prescribed distribution, assigned manually, or by some other assignment mechanism. Once the RNN weights have been initialized, the RNN may act as a function, such that it may receive a sequence and produce a RNN result. As such, at least one sequence may be propagated through the RNN to produce a RNN result. For training, a training dataset is composed of one or more sequences and desired RNN results, where the desired RNN results represent the "ground truth", or the true RNN results that should be returned for the given sequences. For clarity, and consistency with previous discussions of machine-learned model training, the desired or true RNN results will be referred to as targets. When processing sequences, the RNN result produced by the RNN is compared to the associated target. The comparison of a RNN result to the target(s) is typically performed by a loss function. As before, other names for this comparison function such as "error function" and "cost function" are commonly employed. Many types of loss functions are available, such as the mean squared error function, however, the general characteristic of a loss function is that the loss function provides a numerical evaluation of the similarity between the RNN result and the associated target(s). The loss function may also be constructed to impose additional constraints on the values assumed by RNN weights, for example, by adding a penalty term, which may be physics-based, or a regularization term. Generally, the goal of a training procedure is to alter the RNN weights to promote similarity between the RNN results and associated targets over the training dataset. Thus, the loss function is used to guide changes made to the RNN weights, typically through a process called "back-propagation through time."

Figure 3C:
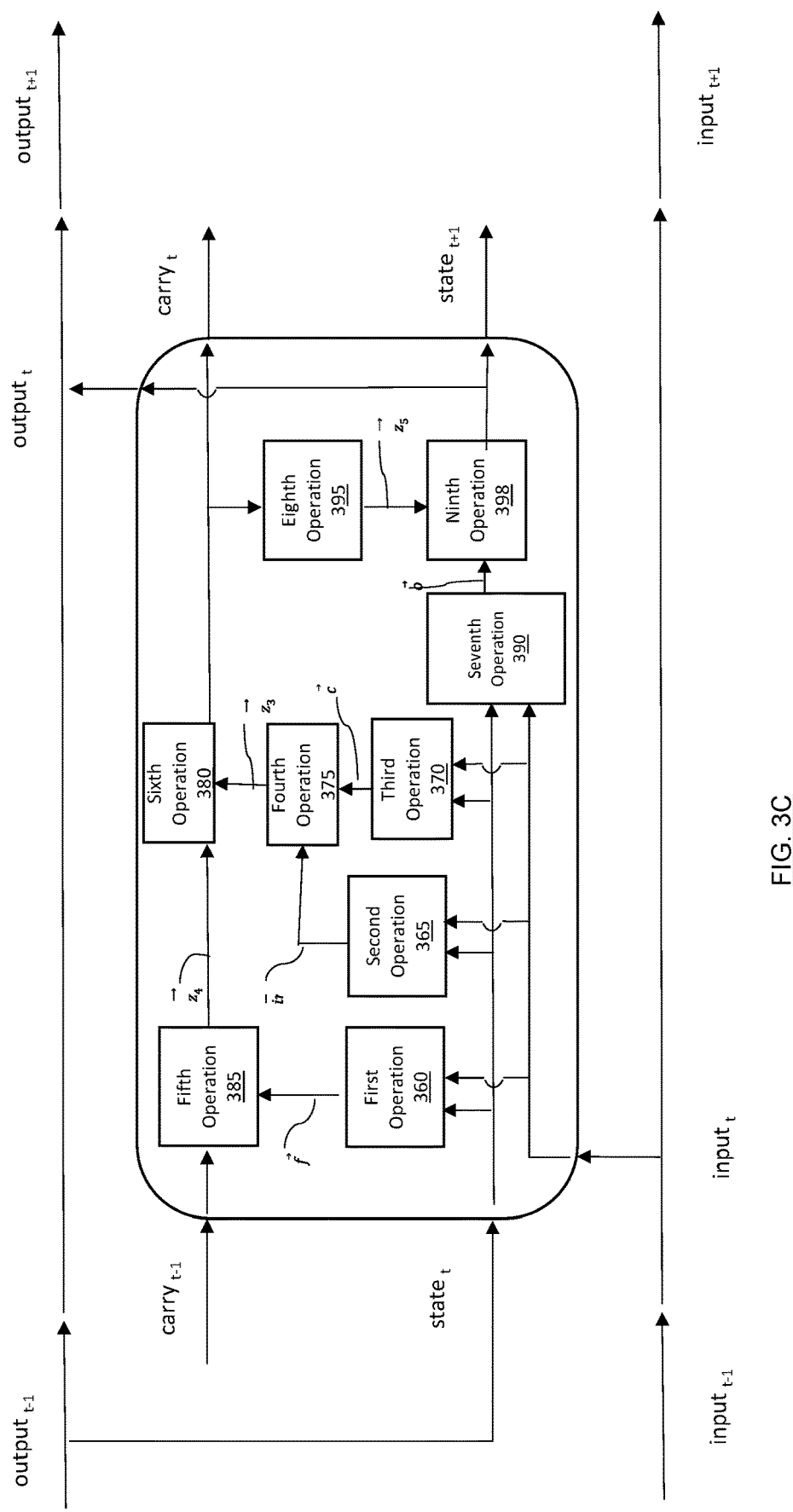
FIG. 3C illustrates a long short-term memory (LTSM) network in accordance with one or more embodiments.

A LSTM network may be considered a specific, and more complex, instance of a RNN. FIG. 3C is an unrolled depiction of a LSTM where the internal components of the LSTM are displayed as labelled abstractions. A LSTM, like a RNN, has a recurrent connection, such that the output produced by a single input in a sequence is forwarded as the state to be used with the subsequent input. However, an LSTM also possesses another "state-like" data structure commonly referred to as the "carry." The carry, like the state and input may be a scalar, vector, matrix, or tensor of any rank depending on the context of the application. Like unto the description of the RNN, for simplicity, the carry will be considered a vector in the following discussion of the LSTM. The LSTM receives an input, state, and carry and produces an output and a new carry. The output and the new carry are passed to the LSTM as the state and carry for the subsequent input. This sequential process, indexed by t, may be described functionally as $$(\text{output}_t, \text{carry}_t) = \text{LSTM Block}(\text{input}_t, \text{carry}_{t-1}, \text{state}_t)$$
$$= \text{LSTM Block}(\text{input}_t, \text{carry}_{t-1}, \text{output}_{t-1}), \quad (6)$$

where the LSTM Block, like the RNN Block, comprises one or more weight matrices and bias vectors and the processing steps necessary to transform an input, state, and carry to an output and new carry.

LSTMs may be configured in a variety of ways, however, the processes depicted in FIG. 3C are the most common. As shown in FIG. 3C, an LSTM Block receives an input ($\text{input}_t$), a state ($\text{state}_t$), and a carry ($\text{carry}_{t-1}$). Again, assuming that the inputs, carry, and outputs are all vectors, the weights of the LSTM Block may be considered to reside in eight matrices and four bias vectors. These matrices and vectors are conventionally named $W_i$, $U_i$, $W_f$, $U_f$, $W_c$, $U_c$, $W_o$, $U_o$, and $\vec{b}_i$, $\vec{b}_f$, $\vec{b}_c$, $\vec{b}_o$, respectively. The processes of the LSTM Block are as follows. Block 360 represents the following first operation $$\vec{f} = a_1(U_f \cdot \text{state}_t + W_f \cdot \text{input}_t + \vec{b}_f), \quad (7)$$

where $a_1$ is an activation function applied elementwise to the result of the parenthetical expression and the resulting vector is $\vec{f}$. Block 365 implements the following second operation $$\vec{\iota} = a_2(U_i \cdot \text{state}_t + W_i \cdot \text{input}_t + \vec{b}_i), \quad (8)$$

where $a_2$ is an activation function which may be the same or different to $a_1$ and is applied elementwise to the result of the parenthetical expression. The resulting vector is $\vec{\iota}$. Block 370 implements the following third operation $$\vec{c} = a_3(U_c \cdot \text{state}_t + W_c \cdot \text{input}_t + \vec{b}_c), \quad (9)$$

where $a_3$ is an activation function which may be the same or different to either $a_1$ or $a_2$ and is applied elementwise to the result of the parenthetical expression. The resulting vector is $\vec{c}$. In block 375, vectors $\vec{\iota}$ and $\vec{c}$ are multiplied according to a fourth operation $$\vec{z}_3 = \vec{\iota} \odot \vec{c}, \quad (10)$$

where $\odot$ indicates the Hadamard product (i.e., elementwise multiplication). Likewise, in block 385 the carry vector from the previous sequential input ($\text{carry}_{t-1}$) vector and the vector $\vec{f}$ are multiplied according to a fifth operation $$\vec{z}_4 = \text{carry}_{t-1} \odot \vec{f}. \quad (11)$$

The results of the operations of blocks 375 and 385 ($\vec{z}_3$ and $\vec{z}_4$, respectively) are added together in block 380, a sixth operation, to form the new carry ($\text{carry}_t$);

$$\text{carry}_t = \vec{z}_3 + \vec{z}_4. \quad (12)$$

In block 390, the current input and state vectors are processed according to a seventh operation $$\vec{o} = a_4(U_o \cdot \text{state}_t + W_o \cdot \text{input}_t + \vec{b}_o), \quad (13)$$

where $a_4$ is an activation function which may be unique or identical to any other used activation function and is applied elementwise to the result of the parenthetical expression. The result is the vector $\vec{o}$. In block 395, an eighth operation, the new carry ($\text{carry}_t$) is passed through an activation function $a_5$. The activation as is usually the hyperbolic tangent function but may be any known activation function. The eighth operations (block 395) may be represented as $$\vec{z}_5 = a_5(\text{carry}_t). \quad (14)$$

Finally, the output of the LSTM Block (output t) is determined in block 398 by taking the Hadamard product of $\vec{z}_5$ and $\vec{o}$, a ninth operation shown mathematically as $$\text{output}_t = \vec{z}_5 \odot \vec{o}. \quad (15)$$

The output of the LSTM Block is used as the state vector for the subsequent input. Again, as in the case of the RNN, the outputs of the LSTM Block applied to a sequence of inputs may be stored and further processed or, in some implementations, only the final output is retained. While the processes of the LSTM Block described above used vector inputs and outputs, it is emphasized that an LSTM network may be applied to sequences of any dimensionality. In these circumstances the rank and size of the weight tensors will change accordingly. One with ordinary skill in the art will recognize that there are many alterations and variations that can be made to the general LSTM structure described herein, such that the description provided does not impose a limitation on the present disclosure.

Embodiments disclosed herein may be implemented on a computer system. FIG. 4 is a block diagram of a computer system 402 used to provide computational functionalities associated with described algorithms, methods, functions, processes, flows, and procedures as described in the instant disclosure, according to one or more embodiments. The illustrated computer 402 is intended to encompass any computing device such as a server, desktop computer, laptop/notebook computer, wireless data port, smart phone, personal data assistant (PDA), tablet computing device, one or more processors within these devices, or any other suitable processing device such as an edge computing device, including both physical or virtual instances (or both) of the computing device. An edge computing device is a dedicated computing device that is, typically, physically adjacent to the process or control with which it interacts. For example, the AI model may be implemented on an edge computing device in order to quickly provide optimal sets of well operational parameters and hydrogen extraction configuration parameters to associated field devices or their controllers (e.g., control system).

Additionally, the computer 402 may include a computer that includes an input device, such as a keypad, keyboard, touch screen, or other device that can accept user information, and an output device that conveys information associated with the operation of the computer 402, including digital data, visual, or audio information (or a combination of information), or a GUI.

The computer 402 can serve in a role as a client, network component, a server, a database or other persistency, or any other component (or a combination of roles) of a computer system for performing the subject matter described in the instant disclosure. In some implementations, one or more components of the computer 402 may be configured to operate within environments, including cloud-computing-based, local, global, or other environment (or a combination of environments).

At a high level, the computer 402 is an electronic computing device operable to receive, transmit, process, store, or manage data and information associated with the described subject matter. According to some implementations, the computer 402 may also include or be communicably coupled with an application server, e-mail server, web server, caching server, streaming data server, business intelligence (BI) server, or other server (or a combination of servers).

The computer 402 can receive requests over network 430 from a client application (for example, executing on another computer 402 and responding to the received requests by processing the said requests in an appropriate software application. In addition, requests may also be sent to the computer 402 from internal users (for example, from a command console or by other appropriate access method), external or third-parties, other automated applications, as well as any other appropriate entities, individuals, systems, or computers.

Each of the components of the computer 402 can communicate using a system bus 403. In some implementations, any or all of the components of the computer 402, both hardware or software (or a combination of hardware and software), may interface with each other or the interface 404 (or a combination of both) over the system bus 403 using an application programming interface (API) 412 or a service layer 413 (or a combination of the API 412 and service layer 413. The API 412 may include specifications for routines, data structures, and object classes. The API 412 may be either computer-language independent or dependent and refer to a complete interface, a single function, or even a set of APIs. The service layer 413 provides software services to the computer 402 or other components (whether or not illustrated) that are communicably coupled to the computer 402. The functionality of the computer 402 may be accessible for all service consumers using this service layer. Software services, such as those provided by the service layer 413, provide reusable, defined business functionalities through a defined interface. For example, the interface may be software written in JAVA, C++, or other suitable language providing data in extensible markup language (XML) format or another suitable format. While illustrated as an integrated component of the computer 402, alternative implementations may illustrate the API 412 or the service layer 413 as stand-alone components in relation to other components of the computer 402 or other components (whether or not illustrated) that are communicably coupled to the computer 402. Moreover, any or all parts of the API 412 or the service layer 413 may be implemented as child or sub-modules of another software module, enterprise application, or hardware module without departing from the scope of this disclosure.

The computer 402 includes an interface 404. Although illustrated as a single interface 404 in FIG. 4, two or more interfaces 404 may be used according to particular needs, desires, or particular implementations of the computer 402. The interface 404 is used by the computer 402 for communicating with other systems in a distributed environment that are connected to the network 430. Generally, the interface 404 includes logic encoded in software or hardware (or a combination of software and hardware) and operable to communicate with the network 430. More specifically, the interface 404 may include software supporting one or more communication protocols associated with communications such that the network 430 or interface's hardware is operable to communicate physical signals within and outside of the illustrated computer 402.

The computer 402 includes at least one computer processor 405. Although illustrated as a single computer processor 405 in FIG. 4, two or more processors may be used according to particular needs, desires, or particular implementations of the computer 402. Generally, the computer processor 405 executes instructions and manipulates data to perform the operations of the computer 402 and any algorithms, methods, functions, processes, flows, and procedures as described in the instant disclosure.

The computer 402 also includes a memory 406 that holds data for the computer 402 or other components (or a combination of both) that can be connected to the network 430. The memory may be a non-transitory computer readable medium. For example, memory 406 can be a database storing data consistent with this disclosure. Although illustrated as a single memory 406 in FIG. 4, two or more memories may be used according to particular needs, desires, or particular implementations of the computer 402 and the described functionality. While memory 406 is illustrated as an integral component of the computer 402, in alternative implementations, memory 406 can be external to the computer 402.

The application 407 is an algorithmic software engine providing functionality according to particular needs, desires, or particular implementations of the computer 402, particularly with respect to functionality described in this disclosure. For example, application 407 can serve as one or more components, modules, applications, etc. Further, although illustrated as a single application 407, the application 407 may be implemented as multiple applications 407 on the computer 402. In addition, although illustrated as integral to the computer 402, in alternative implementations, the application 407 can be external to the computer 402.

There may be any number of computers 402 associated with, or external to, a computer system containing computer 402, wherein each computer 402 communicates over network 430. Further, the term "client," "user," and other appropriate terminology may be used interchangeably as appropriate without departing from the scope of this disclosure. Moreover, this disclosure contemplates that many users may use one computer 402, or that one user may use multiple computers 402.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A method comprising:
obtaining field data from a hydrogen-containing formation, wherein the field data is obtained using field sampling, a laboratory analysis, and at least one geophysical survey of the hydrogen-containing formation;
generating, by a computer processor and a first model, a first surface production rate based on the field data;
generating, by the computer processor and a second model, a first compression value based on the field data, wherein the first compression value is a first liquid hydrogen pressure used to fracture the hydrogen-containing formation;
generating, by the computer processor and a third model, a first well path and a first set of one or more well separation distances based on the field data;
generating, by the computer processor and a fourth model, a first fracture half-length based on the field data, wherein the first fracture half-length is half of a total length of a fracture;
generating, by the computer processor and a fifth model, a first well production rate based on the field data;
determining, by the computer processor, a plurality of operational parameters for a hydraulic fracturing operation based on the first surface production rate, the first compression value, the first fracture half-length, the first well path, the first set of one or more well separation distances, and the first well production rate, wherein the plurality of operational parameters comprises the first compression value and a liquid hydrogen temperature at or below −253° C.; and
injecting, by a control system, pressurized liquid hydrogen into a wellbore based on the plurality of operational parameters for the hydraulic fracturing operation,
wherein the wellbore is connected to the hydrogen-containing formation.

2. The method of claim 1,
wherein the first model employs a first machine-learning (ML) algorithm and uses the field data as input,
wherein the second model employs a second ML algorithm and uses the field data as input,
wherein the third model employs a third ML algorithm and uses the field data as input,
wherein the fourth model employs a fourth ML algorithm and uses the field data as input, and
wherein the fifth model employs a fifth ML algorithm and uses the field data as input.

3. The method of claim 1, wherein the field data comprises geological data, petrophysical data, geochemical data, and economic data.

4. The method of claim 2, wherein the first model, the second model, the third model, the fourth model, and the fifth model comprise a long short-term memory (LSTM) network.

5. The method of claim 2, further comprising:
collecting a first set of operations data corresponding to the hydrogen-containing formation based on one or more field operations;
training the first model using the first set of operations data and the field data, wherein the first model is trained to produce a second surface production rate;
training the second model using the first set of operations data and the field data, wherein the second model is trained to produce a second compression value, wherein the second compression value is a second liquid hydrogen pressure used to fracture, during the hydraulic fracturing operation, the hydrogen-containing formation;
training the third model using the first set of operations data and the field data, wherein the third model is trained to produce a second well path and a second set of one or more well separation distances;
training the fourth model using the first set of operations data and the field data, wherein the fourth model is trained to produce a second fracture half-length; and
training the fifth model using the first set of operations data and the field data, wherein the fifth model is trained to produce a second well production rate.

6. A method comprising:
injecting a pressurized liquid hydrogen into a hydrogen-containing formation, wherein the pressurized liquid hydrogen comprises a liquid hydrogen temperature at or below −253° C.,
wherein the pressurized liquid hydrogen is injected using a first compression value based on field data;
fracturing, during a hydraulic fracturing operation, the hydrogen-containing formation using the pressurized liquid hydrogen, forming a fractured hydrogen-containing formation; and
recovering natural hydrogen from the fractured hydrogen-containing formation.

7. The method of claim 6, further comprising:
obtaining the field data from the hydrogen-containing formation, wherein the field data is obtained using field sampling, a laboratory analysis, and at least one geophysical survey of the hydrogen-containing formation;
generating, by a computer processor and a first model, a first surface production rate based on the field data;
generating, by the computer processor and a second model, the first compression value based on the field data, wherein the first compression value is a first liquid hydrogen pressure used to fracture, during the hydraulic fracturing operation, the hydrogen-containing formation;
generating, by the computer processor and a third model, a first well path and a first set of one or more well separation distances based on the field data;
generating, by the computer processor and a fourth model, a first fracture half-length based on the field data, wherein the first fracture half-length is half of a total length of a fracture;
generating, by the computer processor and a fifth model, a first well production rate based on the field data;
determining, by the computer processor, a plurality of operational parameters for the hydraulic fracturing operation based on the first surface production rate, the first compression value, the first fracture half-length, the first well path, the first set of one or more well separation distances, and the first well production rate, wherein the plurality of operational parameters comprises the first compression value and the liquid hydrogen temperature; and injecting, by a control system, the pressurized liquid hydrogen into a wellbore based on the plurality of operational parameters for the hydraulic fracturing operation, wherein the wellbore is connected to the hydrogen-containing formation.

8. The method of claim 7,
wherein the first model employs a first machine-learning (ML) algorithm and uses the field data as input,
wherein the second model employs a second ML algorithm and uses the field data as input,
wherein the third model employs a third ML algorithm and uses the field data as input,
wherein the fourth model employs a fourth ML algorithm and uses the field data as input, and
wherein the fifth model employs a fifth ML algorithm and uses the field data as input.

9. The method of claim 7, wherein the field data comprises geological data, petrophysical data, geochemical data, and economic data.

10. The method of claim 8, wherein the first model, the second model, the third model, the fourth model, and the fifth model comprise a long short-term memory (LSTM) network.

11. The method of claim 8, further comprising:
collecting a first set of operations data corresponding to the hydrogen-containing formation based on one or more field operations;
training the first model using the first set of operations data and the field data, wherein the first model is trained to produce a second surface production rate;
training the second model using the first set of operations data and the field data, wherein the second model is trained to produce a second compression value, wherein the second compression value is a second liquid hydrogen pressure used to fracture, during the hydraulic fracturing operation, the hydrogen-containing formation;
training the third model using the first set of operations data and the field data, wherein the third model is trained to produce a second well path and a second set of one or more well separation distances;
training the fourth model using the first set of operations data and the field data, wherein the fourth model is trained to produce a second fracture half-length; and
training the fifth model using the first set of operations data and the field data, wherein the fifth model is trained to produce a second well production rate.

12. A system comprising:
a hydraulic fracturing system coupled to a hydrogen-containing formation,
wherein the hydraulic fracturing system is configured to:
inject a pressurized liquid hydrogen into the hydrogen-containing formation,
wherein the pressurized liquid hydrogen comprises a liquid hydrogen temperature at or below −253° C.,
wherein the pressurized liquid hydrogen is injected using a first compression value based on field data;
fracture, during a hydraulic fracturing operation, the hydrogen-containing formation using the pressurized liquid hydrogen, forming a fractured hydrogen-containing formation, and
recover natural hydrogen from the fractured hydrogen-containing formation; and
a well monitoring system configured to perform a method comprising:
receive, by a computer processor, the field data obtained from the hydrogen-containing formation wherein the field data is obtained using field sampling, a laboratory analysis, and at least one geophysical survey of the hydrogen-containing formation;
generate, by the computer processor and a first model, a first surface production rate based on the field data;
generate, by the computer processor and a second model, the first compression value based on the field data, wherein the first compression value is a first liquid hydrogen pressure used to fracture the hydrogen-containing formation;
generate, by the computer processor and a third model, a first well path and a first set of one or more well separation distances based on the field data;
generate, by the computer processor and a fourth model, a first fracture half-length based on the field data, wherein the first fracture half-length is half of a total length of a fracture;
generate, by the computer processor and a fifth model, a first well production rate based on the field data;
determine, by the computer processor, a plurality of operational parameters for the hydraulic fracturing operation based on the first surface production rate, the first compression value, the first fracture half-length, the first well path, the first set of one or more well separation distances, and the first well production rate,
wherein the plurality of operational parameters comprises the first compression value and the liquid hydrogen temperature; and
inject, by a control system, the pressurized liquid hydrogen into a wellbore based on the plurality of operational parameters for the hydraulic fracturing operation, wherein the wellbore is connected to the hydrogen-containing formation.

13. The system of claim 12,
wherein the first model employs a first machine-learning (ML) algorithm and uses the field data as input,
wherein the second model employs a second ML algorithm and uses the field data as input,
wherein the third model employs a third ML algorithm and uses the field data as input,
wherein the fourth model employs a fourth ML algorithm and uses the field data as input, and
wherein the fifth model employs a fifth ML algorithm and uses the field data as input.

14. The system of claim 13, wherein the first model, the second model, the third model, the fourth model, and the fifth model comprise a long short-term memory (LSTM) network.

15. The system of claim 13, wherein the well monitoring system is further configured to:
collect a first set of operations data corresponding to the hydrogen-containing formation based on one or more field operations;
train the first model using the first set of operations data and the field data, wherein the first model is trained to produce a second surface production rate;
train the second model using the first set of operations data and the field data, wherein the second model is trained to produce a second compression value, wherein the second compression value is a second liquid hydrogen pressure used to fracture, during the hydraulic fracturing operation, the hydrogen-containing formation;

train the third model using the first set of operations data and the field data, wherein the third model is trained to produce a second well path and a second set of one or more well separation distances;

train the fourth model using the first set of operations data and the field data, wherein the fourth model is trained to produce a second fracture half-length; and train the fifth model using the first set of operations data and the field data, wherein the fifth model is trained to produce a second well production rate.

* * * * *